United States Patent [19]

Park

[11] Patent Number: 5,661,815
[45] Date of Patent: Aug. 26, 1997

[54] VOLUME RESERVATION APPARATUS OF AN AUDIO SYSTEM AND A METHOD THEREOF

[75] Inventor: Yong Seung Park, Daeku, Rep. of Korea

[73] Assignee: Goldstr Electron Co., Ltd., Cheongju, Rep. of Korea

[21] Appl. No.: 384,301

[22] Filed: Feb. 6, 1995

[30] Foreign Application Priority Data

Feb. 8, 1994 [KR] Rep. of Korea ............... 2455/1994

[51] Int. Cl.⁶ ........................................... H03G 3/00
[52] U.S. Cl. .................... 381/108; 381/109; 381/119
[58] Field of Search ............................... 381/107, 108, 381/104, 119, 109

[56] References Cited

U.S. PATENT DOCUMENTS

| | | |
|---|---|---|
| 4,363,001 | 12/1982 | Suzuki et al. ............ 330/107 |
| 4,402,246 | 9/1983 | Ekiguchi ............ 84/345 |
| 5,054,077 | 10/1991 | Suzuki ............ 381/107 |
| 5,268,964 | 12/1993 | Watts ............ 381/107 |

*Primary Examiner*—Forester W. Isen
*Attorney, Agent, or Firm*—Fleshner & Kim

[57] ABSTRACT

A volume reservation apparatus of an audio system stores data corresponding to currently-produced volume of sound and volume reservation data corresponding to the volume preprogrammed by a user for calculating a difference between the data at the time of wake-up reservation to supply a stepper-motor driving pulse corresponding to the difference, so that the preprogammed volume of sound is produced at the time of reservation. Also, a volume reservation method is provided, thereby solving the inherent problem of unsatisfactory wake-up indication effect resulting from the supply of recently-set low volume at a preprogrammed wake-up time when the wake-up time is preprogrammed under low volume state or a sleep-time function is preprogrammed under low volume state prior to preprogramming the wake-up time.

6 Claims, 3 Drawing Sheets

VOLUME RESERVATION APPARATUS OF AN AUDIO SYSTEM AND A METHOD THEREOF

BACKGROUND OF THE INVENTION

1. Field of the Invention

The present invention relates to a volume controlling technique in an audio system, and more particularly to a volume reservation apparatus and method of an audio system for preprogramming volume of sound to be produced and supplying the preprogrammed volume of sound at a preset wake-up reservation time.

2. Description of the Prior Art

A volume controlling apparatus of a general audio system, as illustrated in FIG. 1, includes a remote controller 1 for supplying a signal corresponding to a key selection manipulated by a user among various keys (not shown) thereon to remotely control the operation of the audio system in terms of the user's desire. Also, a microcomputer 2 receives a signal from the remote controller 1 to control overall operation of the audio system, and a display unit 3 displays predetermined alphanumeric representation under the control of the microcomputer 2. A stepper motor 4 rotates a shaft thereof clockwise or counter-clockwise in response to a driving pulse from the microcomputer 2, so that a variable resistance adjusting plate 5 coupled to the upper portion of the shaft is rotated clockwise or counter-clockwise. Upon the rotation of the variable resistance adjusting plate 5, a belt V placed along the side of the variable resistance adjusting plate 5 travels to vary a resistance value of a variable resistor 6. In addition to these, the volume controlling apparatus has an amplifier 7 controlled by a variable output of the variable resistor 6 according to the variable resistance value, for amplifying a received audio signal Au by a predetermined amplification factor to supply the amplified audio signal toward a speaker SP.

An operation of the volume controlling apparatus of the audio system constructed as above will be briefly described as below.

When the user presses a volume-up key (not shown) of the remote controller 1 in order to raise volume of sound produced from the audio system, a signal corresponding to the volume-up key is supplied from the remote controller 1 to the microcomputer 2 in the form of an infrared signal or high frequency signal.

Otherwise, if the user presses a volume-up key (not shown) on an unshown main body of the audio system in order to raise the volume of sound produced therefrom, a signal corresponding to the volume-up key is supplied to the microcomputer 2.

At this time, the instance of pressing the volume-up key on the main body of the audio system will be omitted for the purpose of simplifying the description.

Then, the microcomputer 2 receives an output signal of the remote controller 1 via a remote signal input terminal IN, and supplies a driving pulse P1 to an input terminal + of the stepper motor 4 via an output terminal OUT1 thereof.

By this operation, the stepper motor 4 is driven to rotate its shaft clockwise, i.e., in the direction to raise the volume, so that the viable resistance adjusting plate 5 coupled to the upper portion of the shaft is rotated clockwise. At the same time, the belt V provided along the side of the variable resistance adjusting plate 5 travels clockwise by as long as a predetermined distance to vary the resistance value of the variable resistor 6, thereby varying the output of the variable resistor 6.

It is a well known structural expedient in the art that the variable resistance adjusting plate 5 can be manually rotated clockwise or counter-clockwise by the user in a direct manner.

The amplifier 7 is controlled by the variable output of the variable resistor 6 to amplify the input signal, i.e., the audio signal Au reproduced from a magnetic tape or disc, thereby supplying the amplified signal to the speaker SP.

Meanwhile, if the user presses a volume-down key (not shown) of the remote controller 1 to lower the volume of sound produced from the audio system, a signal corresponding to the volume-down key is supplied from the remote controller 1 to the microcomputer 2.

The microcomputer 2 receives the output signal of the remote controller 1 via the remote signal input terminal IN, and supplies a driving pulse P2 to an input terminal − of the stepper motor 4 via an output terminal OUT2 thereof.

By this operation, the stepper motor 4 is driven to be rotated counter-clockwise, i.e., in the direction to lower the volume, so that the variable resistance adjusting plate 5 is rotated counter-clockwise. At the same time, the belt V travels counter-clockwise by as long as a predetermined distance to vary the resistance value of the variable resistor 6, thereby varying the output of the variable resistor 6.

The amplifier 7 is then controlled by the variable output of the variable resistor 6 to deamplify the input signal, i.e., the reproduced audio signal Au, thereby supplying the deamplified signal to the speaker SP.

According to the above-described method, the user adjusts the volume of sound from the speaker of the audio system in a remote distance or manually.

On the other hand, when the user preprograms a sleep-time reservation by pressing a sleep-time reservation by (not shown) of the remote controller 1 or a wake-up time reservation by pressing a wake-up reservation key (not shown), the microcomputer 2 receives a signal from the remote controller 1 to determine whether the received signal is for preprogramming the sleep or wake-up time, and stores the reservation time in a storage unit therein while displaying the reservation time on the display unit 3.

Therefore, the microcomputer 2 stops the sound from the speaker SP of the audio system when the current time coincides with the sleep reservation time in case of the sleep-time reservation; whereas it initiates the operation of the audio system to output the sound via the speaker SP when the current time coincides with the wake-up reservation time in case of the wake-up time reservation.

In the conventional audio system, however, if the user preprograms the wake-up time reservation or preprograms the sleep-time reservation and then wake-up time reservation under the state that the volume of sound from the speaker is low, the volume-down sound prior to preprogramming the wake-up time is produced from the speaker when the current time coincides with the preprogrammed wake-up time with the consequence of deteriorating the effect of satisfactory wake-up indication.

In other words, the conventional audio system has no volume reservation function involving a drawback that the sound of desired volume cannot be supplied at the preprogammed time.

SUMMARY OF THE INVENTION

It is an object of the present invention to provide a volume reservation apparatus and method of an audio system capable of providing sound of preprogrammed volume from a speaker of the audio system at preprogrammed wake-up time.

To achieve the above object of the present invention, there is provided a volume reservation apparatus of an audio system which includes a volume detecting portion for detecting volume of sound from the audio system, and a microcomputer for comparing volume reservation data corresponding to preprogammed volume with the volume detection data to supply a predetermined driving pulse. Furthermore, a stepper motor varies variable resistance values of variable resistor portions upon the receipt of the driving pulse, and an amplifier controlled by the variable output of the variable resistor portion according to the variable resistance value amplifies an input audio signal to a level corresponding to the preprogrammed volume.

To achieve the above and other objects of the present invention, a volume reservation method of an audio system is performed by steps of storing reservation volume data corresponding to preprogrammed volume of sound and volume detection data corresponding to recently-detected volume of sound, and comparing the stored reservation volume data with volume detection data when it is the preprogrammed time to supply a predetermined driving pulse. Then, a stepper motor is driven upon the receipt of the driving pulse for changing the volume of produced sound in the detected volume to be the preprogammed volume.

BRIEF DESCRIPTION OF THE DRAWINGS

The above objects and other advantages of the present invention will become more apparent by describing in detail preferred embodiments thereof with reference to the attached drawings in which.

DETAILED DESCRIPTION OF THE PREFERRED EMBODIMENTS

Figure 1:
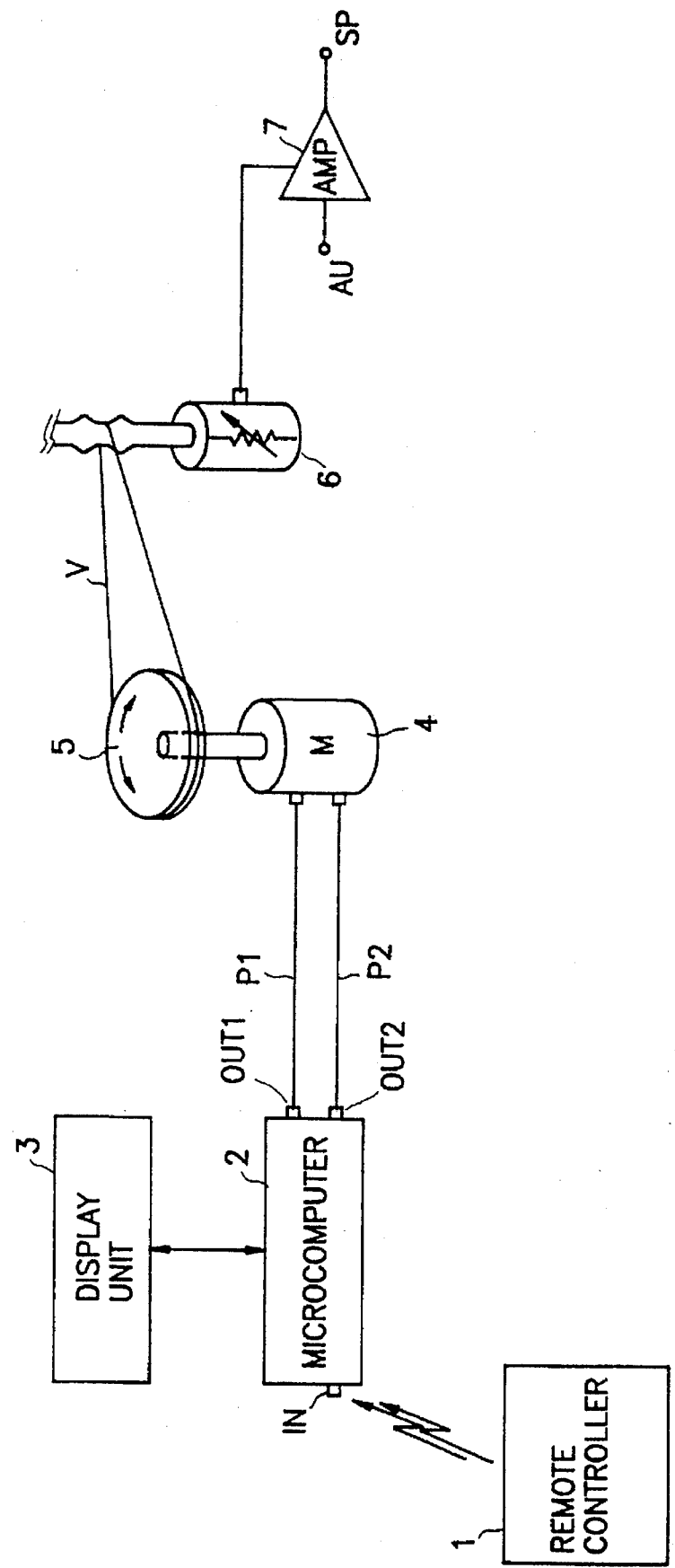
FIG. 1 is a schematic view showing a volume controlling apparatus of a general audio system.
Figure 2:
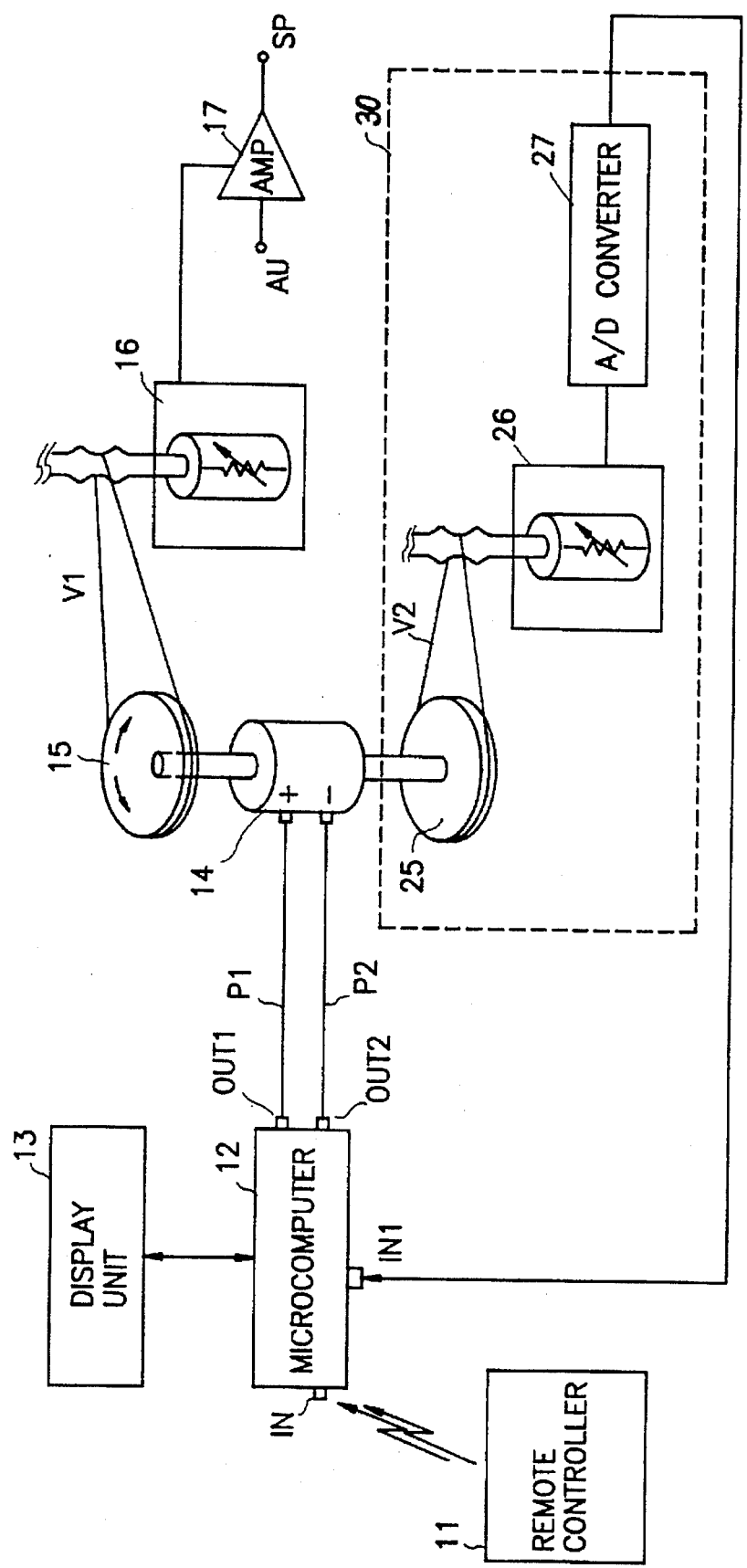
FIG. 2 is a block diagram showing a volume reservation apparatus of an audio system according to the present invention.

Referring to FIG. 2, a volume reservation apparatus of an audio system according to the present invention includes a microcomputer 12 for storing reservation time in a storage unit therein upon the reception of a signal input by the manipulation of unshown sleep-time reservation key, wake-up time reservation key, volume reservation key, and the like on a remote controller 11. Simultaneously, the microcomputer 12 stores reservation volume data corresponding to a preprogrammed volume in a first register (not shown), and stores volume detection data corresponding to a preprogrammed volume of sound detected by a volume detecting portion in a second register (not shown). Consequently, the stored volume reservation data is compared with the volume detection data at the point of preprogramming the wake-up time reservation to supply a predetermined driving pulse to a stepper motor 14. A display unit 13 controlled by an output of the microcomputer 12 displays predetermined alphanumeric representation, and the stepper motor 14 rotates variable resistance adjusting plates 15 and 25 respectively coupled to the upper and lower portions of a shaft thereof upon the receipt of the driving pulse from the microcomputer 12. Variable resistors 16 and 26 vary resistance values by the movement of belts V1 and V2 placed along the sides of the variable resistance adjusting plates 15 and 25 when the variable resistance adjusting plates 15 and 25 are rotated.

Additionally, an amplifier 17 which is controlled by a variable output of the variable resistor 16 according to the variable resistance value amplifies a reproduced audio signal Au to supply the amplified audio signal toward a speaker SP, and an analog-to-digital (hereinafter simply referred to as "A/D") converter 27 converts an analog output of the variable resistor 26 into a digital output to supply the result to a volume detecting input terminal IN1.

Here, a reference numeral 30 which denotes the volume detection portion for detecting the volume of sound produced via the speaker SP includes the variable resistance adjusting plate 25, variable resistor 26 and A/D converter 27.

Hereinafter, the operation of the volume reservation apparatus of the audio system according to the present invention will be described in detail.

To begin with, when a user presses a volume-up key (not shown) of the remote controller 11 to raise volume of sound from the audio system, a signal corresponding to the volume-up key is supplied to the microcomputer 12 in the form of an infrared signal or high-frequency signal.

At this time, an instance of pressing a volume-up key in a main body of the audio system will be omitted for simplifying the description.

Then, the microcomputer 12 receives an output signal of the remote controller 11 via a remote signal input terminal IN, and supplies the driving pulse P1 to an input terminal +of the stepper motor 14 via an output terminal OUT1 thereof.

By this operation, the stepper motor 14 is driven to rotate its shaft clockwise, i.e., in the direction to raise the volume, so that the variable resistance adjusting plate 15 coupled to the upper portion of the shaft is rotated clockwise.

At the same time, the variable resistance adjusting plate 25 coupled to the lower portion of the shaft of the stepper motor 14 is rotated clockwise.

The belts V1 and V2 provided along the sides of the variable resistance adjusting plates 15 and 25 thus travel clockwise by as long as predetermined distances to vary the resistance values of the variable resistors 16 and 26, so that resistance values of the variable resistors 16 and 26 are varied corresponding to the travelled distance to vary outputs of the variable resistors 16 and 26, respectively.

It is a well known structural expedient in the art that the variable resistance adjusting plates 15 and 25 can be manually rotated clockwise or counter-clockwise by the user.

Thereafter, the amplifier 17 is controlled by the variable output of the variable resistor 16 to amplify the input signal, i.e., the reproduced audio signal Au, thereby supplying the amplified signal to the speaker SP.

The A/D converter 27 performs analog-to-digital conversion of the variable output of the variable resistor 26 to supply the digitized output signal to the volume detecting input terminal IN1 of the microcomputer 12 as the volume detection data of the currently-output sound.

Thus, the microcomputer 12 stores the volume detection data from the A/D converter 27 in the second register thereof.

Meanwhile, if the user presses a volume-down key (not shown) of the remote controller 11 to lower the volume of sound produced from the audio system, a signal corresponding to the volume-down key is supplied to the microcomputer 12.

The microcomputer 12 receives the output signal of the remote controller 11 via the remote signal input terminal IN, and supplies the driving pulse P2 to an input terminal − of the stepper motor 14 via an output terminal OUT2 thereof.

By this operation, the stepper motor 14 is driven to be rotated counter-clockwise, i.e., in the direction to lower the volume, so that the variable resistance adjusting plates 15 and 25 are rotated counter-clockwise. At the same time, the belts V1 and V2 travel counter-clockwise by as long as predetermined distances to vary the resistance values of the variable resistors 16 and 26, which, in turn, vary the outputs of the variable resistors 16 and 26 corresponding to the travelled distance to vary the outputs of the variable resistors 16 and 26.

The amplifier 17 is then controlled by the variable output of the variable resistor 16 to amplify the input signal, i.e., the reproduced audio signal Au, thereby supplying the amplified signal to the speaker SP.

The A/D converter 27 receives the varied analog output signal of the variable resistor 26 and converts it into a digital signal, and supplies the digitized output signal to the volume detecting input terminal IN1 of the microcomputer 12 as the volume detection data.

Thus, the microcomputer 12 stores the volume detection data from the A/D converter 27 in the second register thereof.

Briefly, when the user preprograms a wake-up time reservation and a volume reservation, the microcomputer stores the wake-up reservation time in the storage unit thereof, stores the volume reservation data to the first register, and compares the volume reservation data with the volume detection data at the time of the wake-up reservation time to supply the predetermined driving pulse to the stepper motor 14, thereby supplying the sound of preprogrammed volume.

Figure 3:
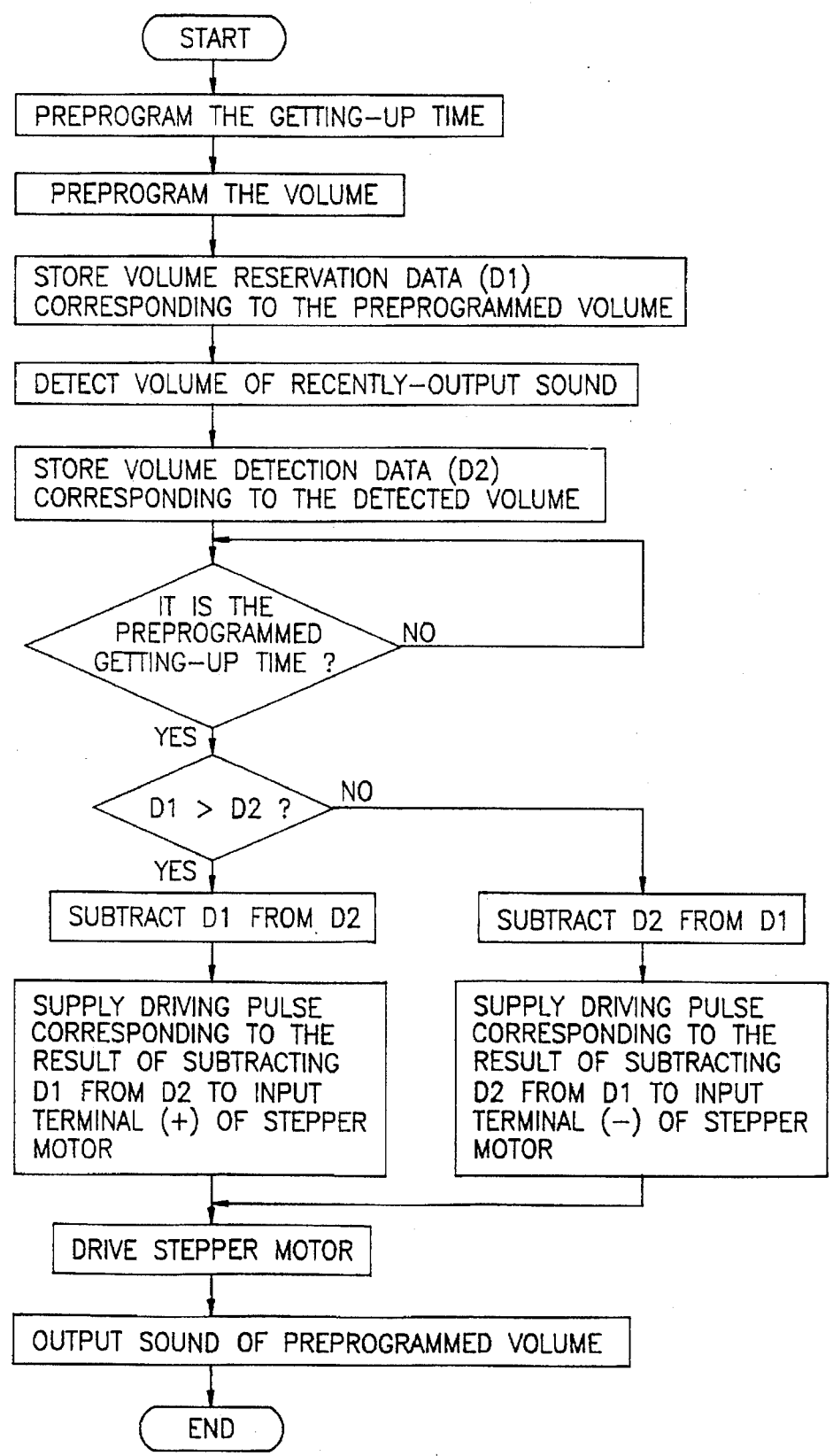
FIG. 3 is a flow chart for illustrating a volume reservation method in the audio system according to the present invention.

Now, a volume reservation method of the audio system according to the present invention will be described with reference to FIGS. 2 and 3.

When the user presses the wake-up time reservation key of the remote controller 11 to preprogram the wake-up time reservation, the microcomputer 12 receives the signal from the remote controller 11 to determine whether the received signal is for preprogramming the wake-up time or not, and stores the wake-up reservation time in the storage unit therein while displaying the reservation time on the display unit 13.

At this time, if the user presses the volume reservation key of the remote controller 11 to preprogram a desired volume of sound produced from the audio system, the microcomputer 12 stores the volume reservation data D1 corresponding to the preprogrammed volume in the first register therein.

Simultaneously, the microcomputer 12 stores the volume detection data D2 currently output from the A/D converter 27 in the second register.

Under this state, the microcomputer 12 compares the wake-up reservation time with current time to initiate the operation of the audio system when the wake-up reservation time is concurrent with the current time while comparing the magnitude of the volume reservation data D1 and volume detection data D2.

Successively, the microcomputer 12 obtains a difference between the data D2 and D1 when the volume detection data D2 is smaller than the volume reservation data D1, and supplies the driving pulse P1 corresponding to the difference to the input terminal + of the stepper motor 14 via the output terminal OUT1.

Meantime, if the volume detection data D2 is greater than the volume reservation data D1, a difference between the data D2 and D1 is obtained to supply the driving pulse P2 corresponding to the difference to the input terminal − of the stepper motor 14 via the output terminal OUT2.

As a result, the sound of preprogrammed volume is produced from the speaker of the audio system at the time of the wake-up reservation.

As described above, the volume of an audio system is preprogrammed to produce desired volume at a preprogrammed time to maximize the effect of wake-up indication.

While the present invention has been particularly shown and described with reference to particular embodiment thereof, it will be understood by those skilled in the art that various changes in form and details may be effected therein without departing from the spirit and scope of the invention as defined by the appended claims.

What is claimed is:

1. A volume reservation apparatus of an audio system comprising:

a volume detecting means for detecting a volume of a sound signal outputted from said audio system and providing volume detection data in accordance with said detection;

a microcomputer for storing volume reservation data corresponding to a preprogrammed volume level and for storing the volume detection data from the volume detecting means, and for comparing the volume reservation data with the volume detection data to supply a driving pulse in accordance with the comparison;

a stepper motor for automatically varying values of a variable resistor means in accordance with said driving pulse from the microcomputer, without manual variation of said values of said variable resistor means;

an amplifier, the output level of which is controlled by said variable resistor means, for amplifying an input audio signal to an output level corresponding to said preprogrammed volume level;

wherein said microcomputer obtains and stores a difference between said volume reservation data and said volume detection data at a time of programming a programmed wake-up time reservation, and supplies said driving pulse corresponding to said difference at the programmed wake-up time.

2. A volume reservation apparatus of an audio system as claimed in claim 1, wherein said microcomputer supplies said driving pulse to rotate variable resistance adjusting plates respectively coupled to a shaft of said stepper motor.

3. The volume reservation apparatus of an audio system as claimed in claim 1, wherein said volume detecting means comprises a variable resistor unit varied in accordance with a driven direction of said stepper motor, and an analog-to-digital converter for converting an output signal of said variable resistor unit from an analog into a digital state, wherein said volume detection data corresponds to the volume of the detected sound signal.

4. The volume reservation apparatus of an audio system as claimed in claim 1, further comprising a remote control for inputting a plurality of commands into said microcomputer.

5. The volume reservation apparatus of an audio system as claimed in claim 4, wherein said plurality of commands includes a command to store a wake-up time reservation into said microcomputer.

6. The volume reservation apparatus of an audio system as claimed in claim 4, wherein said plurality of commands includes a command to store said volume detection data in said microcomputer.

* * * * *